United States Patent
Kanbara et al.

(10) Patent No.: US 10,526,699 B2
(45) Date of Patent: Jan. 7, 2020

(54) SILICON CARBIDE EPITAXIAL SUBSTRATE AND METHOD FOR MANUFACTURING SILICON CARBIDE SEMICONDUCTOR DEVICE

(71) Applicant: SUMITOMO ELECTRIC INDUSTRIES, LTD., Osaka (JP)

(72) Inventors: Kenji Kanbara, Osaka (JP); Takaya Miyase, Osaka (JP); Tsubasa Honke, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 16/340,007

(22) PCT Filed: Jul. 20, 2018

(86) PCT No.: PCT/JP2018/027240
§ 371 (c)(1),
(2) Date: Apr. 5, 2019

(87) PCT Pub. No.: WO2019/049525
PCT Pub. Date: Mar. 14, 2019

(65) Prior Publication Data
US 2019/0242014 A1    Aug. 8, 2019

(30) Foreign Application Priority Data

Sep. 8, 2017 (JP) .................................. 2017-173240

(51) Int. Cl.
C23C 16/42      (2006.01)
C30B 25/02      (2006.01)
(Continued)

(52) U.S. Cl.
CPC .............. *C23C 16/42* (2013.01); *C30B 25/02* (2013.01); *C30B 29/36* (2013.01); *H01L 21/2053* (2013.01); *H01L 29/1608* (2013.01)

(58) Field of Classification Search
CPC ................................................. H01L 29/32–34
See application file for complete search history.

(56) References Cited

U.S. PATENT DOCUMENTS

2009/0317983 A1* 12/2009 Miyanagi .......... H01L 21/02378
                                                             438/795
2011/0006309 A1    1/2011 Momose et al.
(Continued)

FOREIGN PATENT DOCUMENTS

JP      2012-246168 A    12/2012
JP      2014-159355 A     9/2014
(Continued)

*Primary Examiner* — Charles D Garber
*Assistant Examiner* — Alia Sabur
(74) *Attorney, Agent, or Firm* — Baker Botts L.L.P.; Michael A. Sartori

(57) ABSTRACT

A silicon carbide epitaxial film has a plurality of arc-shaped or annular basal plane dislocations and a plurality of threading dislocations. The plurality of threading dislocations have a first threading dislocation which is surrounded by the plurality of basal plane dislocations and a second threading dislocation which is not surrounded by the plurality of basal plane dislocations, when viewed from a direction perpendicular to a main surface. The plurality of basal plane dislocations and the first threading dislocation constitute an annular defect. An area density of the plurality of threading dislocations in the main surface is more than or equal to 50 cm$^{-2}$. A value obtained by dividing an area density of the annular defect when viewed from the direction perpendicular to the main surface by the area density of the plurality of threading dislocations in the main surface is more than or equal to 0.00002 and less than or equal to 0.004.

18 Claims, 6 Drawing Sheets

(51) Int. Cl.
*H01L 29/16* (2006.01)
*H01L 21/205* (2006.01)
*C30B 29/36* (2006.01)
*H01L 21/20* (2006.01)
*H01L 29/12* (2006.01)
*H01L 29/78* (2006.01)

(56) References Cited

U.S. PATENT DOCUMENTS

| | | | |
|---|---|---|---|
| 2014/0054609 A1* | 2/2014 | Burk | H01L 21/3221 257/77 |
| 2015/0028353 A1* | 1/2015 | Mandal | H01L 31/036 257/77 |
| 2017/0275779 A1 | 9/2017 | Nishiguchi et al. | |

FOREIGN PATENT DOCUMENTS

| | | |
|---|---|---|
| JP | 2015-002207 A | 1/2015 |
| JP | 2015-057864 A | 3/2015 |
| JP | 2016-166112 A | 9/2016 |
| WO | 2009/035095 A1 | 3/2009 |
| WO | 2017/061154 A1 | 4/2017 |

* cited by examiner

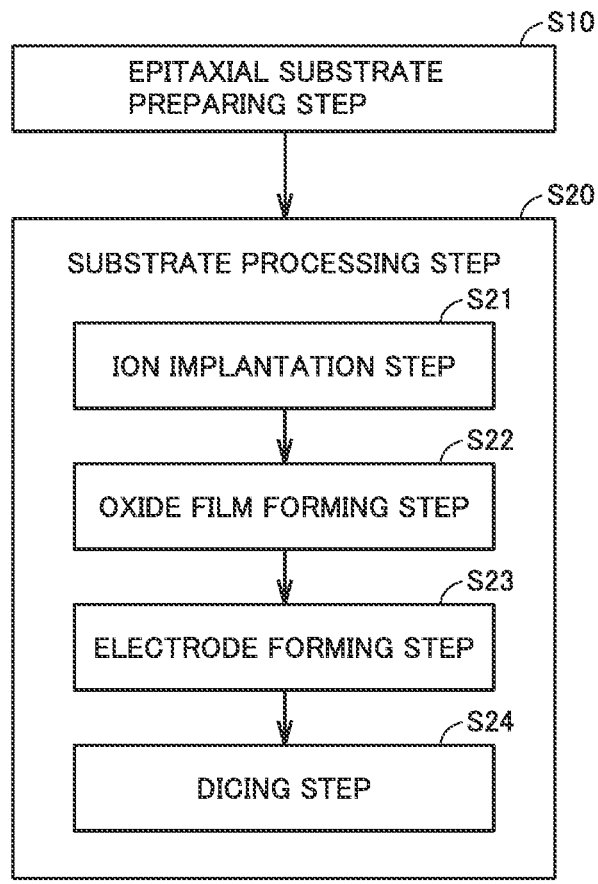
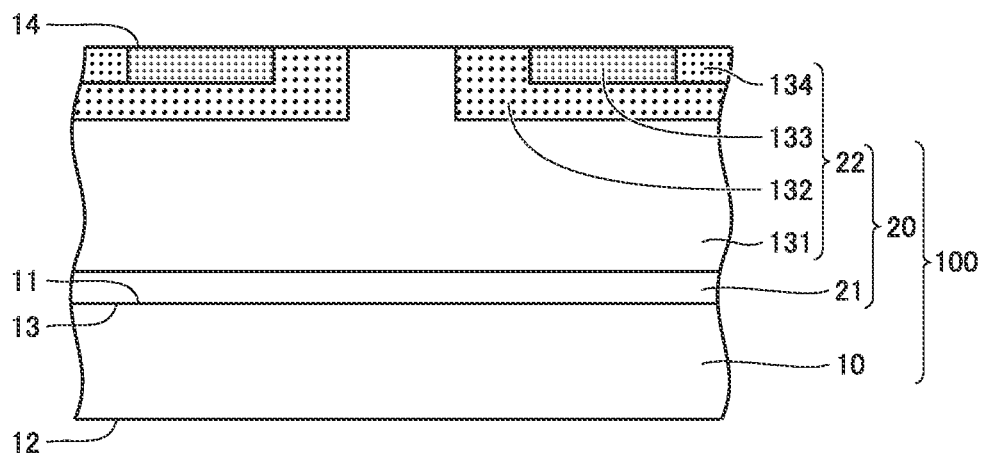

US 10,526,699 B2

SILICON CARBIDE EPITAXIAL SUBSTRATE AND METHOD FOR MANUFACTURING SILICON CARBIDE SEMICONDUCTOR DEVICE

TECHNICAL FIELD

The present disclosure relates to a silicon carbide epitaxial substrate, and a method for manufacturing a silicon carbide semiconductor device. The present application claims a priority based on Japanese Patent Application No. 2017-173240 filed on Sep. 8, 2017, the entire content of which is incorporated herein by reference.

BACKGROUND ART

Japanese Patent Laying-Open No. 2015-57864 (PTL 1) discloses a method for polishing a silicon carbide single crystal substrate.

CITATION LIST

Patent Literature

PTL 1: Japanese Patent Laying-Open No. 2015-57864

SUMMARY OF INVENTION

A silicon carbide epitaxial substrate in accordance with the present disclosure includes a silicon carbide substrate and a silicon carbide epitaxial film. The silicon carbide epitaxial film is on the silicon carbide substrate. The silicon carbide substrate and the silicon carbide epitaxial film have a polytype of 4H. A main surface is a {0001} plane or a plane inclined relative to the {0001} plane by an off angle of less than or equal to 5°. The main surface of the silicon carbide epitaxial film has a maximum diameter of more than or equal to 150 mm. The silicon carbide epitaxial film has a plurality of arc-shaped or annular basal plane dislocations and a plurality of threading dislocations. The plurality of threading dislocations have a first threading dislocation which is surrounded by the plurality of basal plane dislocations and a second threading dislocation which is not surrounded by the plurality of basal plane dislocations, when viewed from a direction perpendicular to the main surface. The plurality basal plane dislocations and the first threading dislocation constitute an annular defect. An area density of the plurality of threading dislocations in the main surface is more than or equal to 50 cm$^{-2}$. A value obtained by dividing an area density of the annular defect when viewed from the direction perpendicular to the main surface by the area density of the plurality of threading dislocations in the main surface is more than or equal to 0.00002 and less than or equal to 0.004.

A silicon carbide epitaxial substrate in accordance with the present disclosure includes a silicon carbide substrate and a silicon carbide epitaxial film. The silicon carbide epitaxial film is on the silicon carbide substrate. The silicon carbide substrate and the silicon carbide epitaxial film have a polytype of 4H. A main surface of the silicon carbide epitaxial film is a (0001) plane or a plane inclined relative to the (0001) plane by an off angle of less than or equal to 5°. The main surface has a maximum diameter of more than or equal to 150 mm. The silicon carbide epitaxial film has a plurality of arc-shaped or annular basal plane dislocations and a plurality of threading dislocations. The plurality of threading dislocations have a first threading dislocation which is surrounded by the plurality of basal plane dislocations and a second threading dislocation which is not surrounded by the plurality of basal plane dislocations, when viewed from a direction perpendicular to the main surface. The plurality of basal plane dislocations and the first threading dislocation constitute an annular defect. The annular defect has a maximum diameter of more than or equal to 0.03 mm and less than or equal to 0.2 mm when viewed from the direction perpendicular to the main surface. An area density of the plurality of threading dislocations in the main surface is more than or equal to 50 cm$^{-2}$. A value obtained by dividing an area density of the annular defect when viewed from the direction perpendicular to the main surface by the area density of the plurality of threading dislocations in the main surface is more than or equal to 0.00002 and less than or equal to 0.004.

BRIEF DESCRIPTION OF DRAWINGS

FIG. 9 is a flowchart schematically showing a method for manufacturing a silicon carbide semiconductor device in accordance with the present embodiment.

FIG. 10 is a schematic cross sectional view showing a first step of the method for manufacturing the silicon carbide semiconductor device in accordance with the present embodiment.

DETAILED DESCRIPTION

Figure 1:
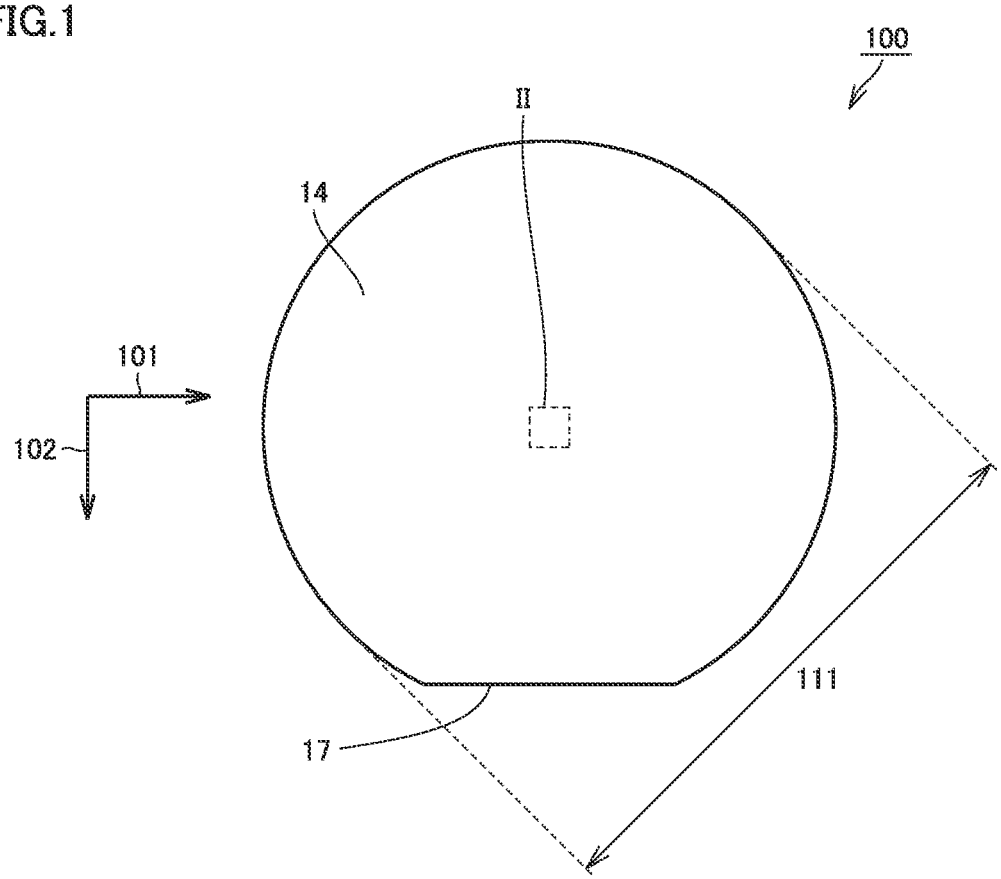
FIG. 1 is a schematic plan view showing a configuration of a silicon carbide epitaxial substrate in accordance with the present embodiment.

Summary of Embodiment of the Present Disclosure

First, a summary of an embodiment of the present disclosure will be described. Regarding crystallographic indications in the present specification, an individual orientation is represented by [ ], a group orientation is represented by < >, an individual plane is represented by ( ) and a group plane is represented by { }. Generally, a negative index is supposed to be crystallographic ally indicated by putting "–" (bar) above a numeral, but is indicated by putting the negative sign before the numeral in the present specification.

(1) A silicon carbide epitaxial substrate 100 in accordance with the present disclosure includes a silicon carbide substrate 10 and a silicon carbide epitaxial film 20. Silicon carbide epitaxial film 20 is on silicon carbide substrate 10. Silicon carbide substrate 10 and silicon carbide epitaxial film 20 have a polytype of 4H. A main surface 14 is a {0001} plane or a plane inclined relative to the {0001} plane by an off angle of less than or equal to 5°. Main surface 14 has a maximum diameter of more than or equal to 150 mm. Silicon carbide epitaxial film 20 has a plurality of arc-shaped or annular basal plane dislocations 3 and a plurality of threading dislocations 4. The plurality of threading dislocations 4 have a first threading dislocation 1 which is surrounded by the plurality of basal plane dislocations 3 and a second threading dislocation 2 which is not surrounded by the plurality of basal plane dislocations 3, when viewed from a direction perpendicular to main surface 14. The plurality of basal plane dislocations 3 and first threading dislocation 1 constitute an annular defect 5. An area density of the plurality of threading dislocations 4 in main surface 14 is more than or equal to 50 cm$^{-2}$. A value obtained by dividing an area density of annular defect 5 when viewed from the direction perpendicular to main surface 14 by the area density of the plurality of threading dislocations 4 in main surface 14 is more than or equal to 0.00002 and less than or equal to 0.004.

(2) In silicon carbide epitaxial substrate 100 in accordance with (1) described above, main surface 14 may be a (0001) plane or a plane inclined relative to the (0001) plane by an off angle of less than or equal to 5°.

(3) In silicon carbide epitaxial substrate 100 in accordance with (1) or (2) described above, annular defect 5 may have a maximum diameter of less than or equal to 0.2 mm when viewed from the direction perpendicular to main surface 14.

(4) in silicon carbide epitaxial substrate 100 in accordance with any of (1) to (3) described above, annular defect 5 may have a maximum diameter of more than or equal to 0.03 mm when viewed from the direction perpendicular to main surface 14.

(5) Silicon carbide epitaxial substrate 100 in accordance with the present disclosure includes silicon carbide substrate 10 and silicon carbide epitaxial film 20. Silicon carbide epitaxial film 20 is on silicon carbide substrate 10. Silicon carbide substrate 10 and silicon carbide epitaxial film 20 have a polytype of 4H. Main surface 14 is a (0001) plane or a plane inclined relative to the (0001) plane by an off angle of less than or equal to 5°. Main surface 14 has a maximum diameter of more than or equal to 150 mm. Silicon carbide epitaxial film 20 has the plurality of arc-shaped or annular basal plane dislocations 3 and the plurality of threading dislocations 4. The plurality of threading dislocations 4 have first threading dislocation 1 which is surrounded by the plurality of basal plane dislocations 3 and second threading dislocation 2 which is not surrounded by the plurality of basal plane dislocations 3, when viewed from a direction perpendicular to main surface 14. The plurality of basal plane dislocations 3 and first threading dislocation 1 constitute annular defect 5. Annular defect 5 has a maximum diameter of more than or equal to 0.03 mm and less than or equal to 0.2 mm when viewed from the direction perpendicular to main surface 14. An area density of the plurality of threading dislocations 4 in main surface 14 is more than or equal to 50 cm$^{-2}$. A value obtained by dividing an area density of annular defect 5 when viewed from the direction perpendicular to main surface 14 by the area density of the plurality of threading dislocations 4 in main surface 14 is more than or equal to 0.00002 and less than or equal to 0.004.

(6) A method for manufacturing a silicon carbide semiconductor device 300 in accordance with the present disclosure includes the steps of preparing silicon carbide epitaxial substrate 100 according to any one of (1) to (5) described above, and processing silicon carbide epitaxial substrate 100.

Details of Embodiment of the Present Disclosure

Hereinafter, details of the embodiment of the present disclosure will be described. In the description below, identical or corresponding elements will be designated by the same reference numerals, and the description thereof will not be repeated.

(Silicon Carbide Epitaxial. Substrate 100)

Figure 2:
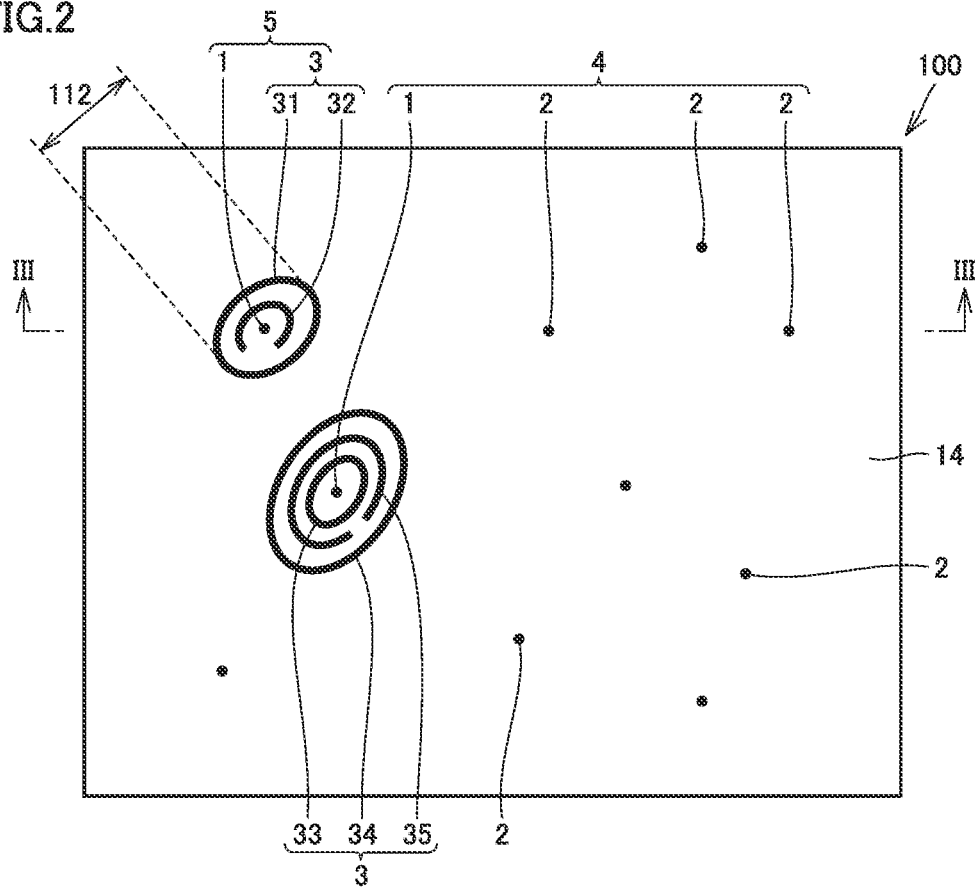
FIG. 2 is an enlarged schematic view of a region II in FIG. 1.
Figure 3:
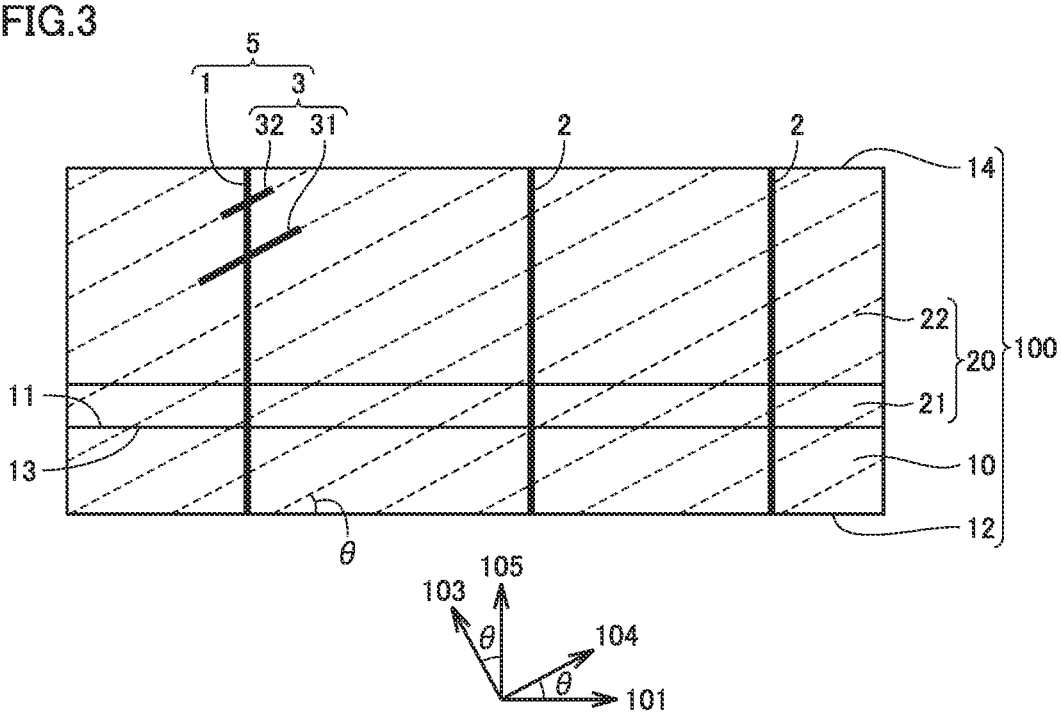
FIG. 3 is a schematic cross sectional view taken along a line III-III in FIG. 2.

As shown in FIGS. 1, 2, and 3, silicon carbide epitaxial substrate 100 in accordance with the present embodiment has silicon carbide substrate 10 and silicon carbide epitaxial film 20. Silicon carbide epitaxial film 20 is on silicon carbide substrate 10. Silicon carbide substrate 10 has a first main face 11, and a second main face 12 opposite to first main face 11. Silicon carbide epitaxial film 20 is in contact with first main face 11. Silicon carbide epitaxial film 20 has a third main face 13 in contact with first main face 11, and main surface 14 opposite to third main face 13. Silicon carbide substrate 10 and silicon carbide epitaxial film 20 have a polytype of 4H. As shown in FIG. 1, silicon carbide epitaxial substrate 100 may be provided with a first flat 17 extending in a first direction 101. Silicon carbide epitaxial substrate 100 may be provided with a second flat extending in a second direction 102 (not shown).

Second direction 102 is a <1-100> direction, for example. First direction 101 is a direction which is parallel to main surface 14 and is perpendicular to second direction 102. First direction 101 is a direction including a component in a <11-20> direction, for example. As shown in FIG. 1, main surface 14 has a maximum diameter 111 of more than or equal to 150 mm, for example. Maximum diameter 111 may be more than or equal to 200 mm, or more than or equal to 250 mm. An upper limit of maximum diameter 111 is not particularly limited. Maximum diameter 111 may be less than or equal to 300 mm, for example.

Silicon carbide substrate 10 is composed of a silicon carbide single crystal, for example. Silicon carbide substrate 10 contains an n type impurity such as nitrogen (N), for example. The conductivity type of silicon carbide substrate 10 is n type, for example. First main face 11 is a {0001} plane or a plane inclined relative to the {0001} plane by an off angle of less than or equal to 5°. When first main face 11 is inclined relative to the {0001} plane, an inclination direction of first main face 11 is the <11-20> direction, for example. Silicon carbide substrate 10 has a thickness of more than or equal to 350 μm and less than or equal to 500 μm, for example.

Silicon carbide epitaxial film 20 contains an n type impurity such as nitrogen, for example. The conductivity type of silicon carbide epitaxial film 20 is a type, for example. Main surface 14 of silicon carbide epitaxial film 20 is a {0001} plane or a plane inclined relative to the {0001} plane by an off angle θ of less than or equal to Specifically, main surface 14 is a (0001) plane or a plane inclined relative to the (0001) plane by off angle θ of less than or equal to 5°. Main surface 14 may be a (000-1) plane or a plane inclined relative to the (000-1) plane by off angle θ of less than or equal to 5°. An off direction is the <11-20> direction, for example. It should be noted that the off direction is not limited to the <11-20> direction. The off direction may be, for example, a <1-100> direction, or a direction having a component in the <1-100> direction and a component in the <11-20> direction. Off angle θ is an angle by which main surface 14 is inclined relative to the {0001} plane. Off angle θ is more than 0° and less than or equal to 5°, for example. Off angle θ may be more than or equal to 1°, or may be more than or equal to 2°. Off angle θ may be less than or equal to 4°.

A plane indicated by a broken line in FIG. 3 is the {0001} plane, for example. A third direction 103 is a direction perpendicular to the {0001} plane. Third direction 103 is a [0001] direction, for example. A fourth direction 104 is a direction perpendicular to third direction 103. Fourth direction 104 is the <11-20> direction, for example. Fourth direction 104 is the off direction, for example. A direction of a normal to main surface 14 is a fifth direction 105. The fifth direction is a direction inclined in the off direction by off angle θ relative to the [0001] direction, for example.

As shown in FIG. 3, silicon carbide epitaxial film 20 includes a first layer 21 and a second layer 22. First layer 21 is a buffer layer, for example. Second layer 22 is a drift layer, for example. First layer 21 is in contact with first main face 11. First layer 21 constitutes third main face 13. Second layer 22 is on first layer 21. Second layer 22 constitutes main surface 14. First layer 21 has a thickness of more than or equal to 0.5 μm and less than or equal to 2 μm, for example. Second layer 22 has a thickness of more than or equal to 5 μm and less than or equal to 30 μm, for example.

Each of first layer 21 and second layer 22 contains an n type impurity such as nitrogen, for example. The n type impurity contained in first layer 21 has a concentration of more than or equal to $1 \times 10^{17}$ cm$^{-3}$ and less than or equal to $1 \times 10^{19}$ cm$^{-3}$, for example. The n type impurity contained in second layer 22 has a concentration of more than or equal to $1 \times 10^{15}$ cm$^{-3}$ and less than or equal to $1 \times 10^{16}$ cm$^{-3}$, for example. The concentration of the n type impurity contained in first layer 21 may be lower than a concentration of the n type impurity contained in silicon carbide substrate 10. The concentration of the n type impurity contained in first layer 21 may be higher than the concentration of the n type impurity contained in second layer 22. The concentration of the n type impurity is measured with a mercury probe C-V measuring device, for example. The probe has an area of 0.005 cm$^2$, for example.

As shown in FIGS. 2 and 3, silicon carbide epitaxial film 20 has the plurality of basal plane dislocations 3 and the plurality of threading dislocations 4. Each of the plurality of basal plane dislocations 3 is in a plane parallel to the {0001} plane. From another viewpoint, each of the plurality of basal plane dislocations 3 extends in a direction parallel to the {0001} plane. Each of the plurality of threading dislocations 4 extends along a direction substantially perpendicular to main surface 14. Each of the plurality of threading dislocations 4 extends from the second main face to main surface 14. Each of the plurality of threading dislocations 4 is provided to penetrate each of silicon carbide epitaxial film 20 and silicon carbide substrate 10. Each of the plurality of threading dislocations 4 is exposed at both second main face 12 and main surface 14. Each threading dislocation may be a threading edge dislocation, or may be a threading screw dislocation.

As shown in FIG. 2, the plurality of threading dislocations 4 have first threading dislocation 1 and second threading dislocation 2. When viewed from the direction perpendicular to main surface 14, first threading dislocation 1 is surrounded by the plurality of basal plane dislocations 3. Second threading dislocation 2 is not surrounded by the plurality of basal plane dislocations 3.

As shown in FIG. 2, the plurality of basal plane dislocations 3 are provided to surround first threading dislocation 1 when viewed from the direction perpendicular to main surface 14. The plurality of basal plane dislocations 3 may surround first threading dislocation 1 completely or partially. Basal plane dislocation 3 is completely annular, for example. Basal plane dislocation 3 may have a substantially circular shape or a substantially elliptical shape when viewed from the direction perpendicular to main surface 14. Basal plane dislocation 3 may be partially annular, rather than being completely annular. Basal plane dislocation 3 may have an arc-shaped portion, for example.

The plurality of basal plane dislocations 3 have a first basal plane dislocation 31, a second basal plane dislocation 32, a third basal plane dislocation 33, a fourth basal plane dislocation 34, and a fifth basal plane dislocation 35, for example. As shown in FIG. 2, first basal plane dislocation 31, third basal plane dislocation 33, and fourth basal plane dislocation 34 are completely annular. Second basal plane dislocation 32 and fifth basal plane dislocation 35 are partially annular.

The plurality of basal plane dislocations 3 and first threading dislocation 1 constitute annular defect 5. Specifically, as shown in FIG. 2, first threading dislocation 1, first basal plane dislocation 31, and second basal plane dislocation 32 constitute one annular defect 5. Further, first threading dislocation 1, third basal plane dislocation 33, fourth basal plane dislocation 34, and fifth basal plane dislocation 35 constitute one annular defect 5. In the field of view in FIG. 2, the number of annular defects 5 is two.

First threading dislocation 1 is surrounded by each of the plurality of basal plane dislocations 3. Each of the plurality of basal plane dislocations 3 may be provided concentrically about first threading dislocation 1 when viewed from the direction perpendicular to main surface 14. The plurality of basal plane dislocations 3 may be located in the same plane, or may be located in different planes. As shown in FIG. 3, first basal plane dislocation 31 may be located in a plane different from a plane for second basal plane dislocation 32. The plane in which first basal plane dislocation 31 is located may be spaced from and parallel to the plane in which second basal plane dislocation 32 is located.

Figure 4:
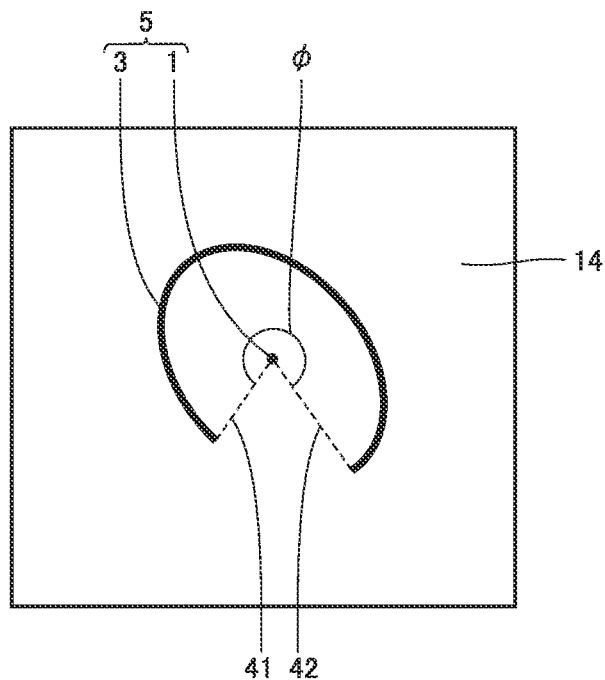
FIG. 4 is a schematic plan view showing a first variation of an annular defect.

FIG. 4 is a schematic plan view showing a first variation of annular defect 5. As shown in FIG. 4, in a case where basal plane dislocation 3 is partially annular, an angle ϕ formed between a first line segment 41 extending from first threading dislocation 1 and passing through one end of basal plane dislocation 3 and a second line segment 42 extending from first threading dislocation 1 and passing through the other end of basal plane dislocation 3 when viewed from the direction perpendicular to main surface 14 is more than or equal to 270°, for example. From another viewpoint, basal plane dislocation 3 surrounds more than or equal to 270° of an outer circumference of first threading dislocation 1. In the plurality of basal plane dislocations 3, all basal plane dislocations 3 may be partially annular, some basal plane dislocations 3 may be partially annular, or all basal plane dislocations 3 may be completely annular.

Figure 5:
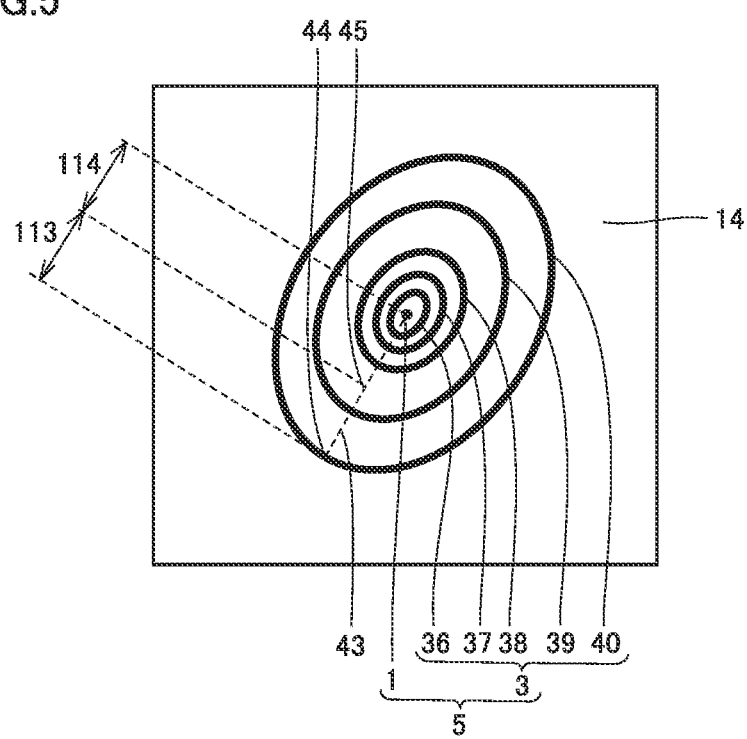
FIG. 5 is a schematic plan view showing a second variation of an annular defect.

FIG. 5 is a schematic plan view showing a second variation of annular defect 5. As shown in FIG. 5, the plurality of basal plane dislocations 3 have a sixth basal plane dislocation 36, a seventh basal plane dislocation 37, an eighth basal plane dislocation 38, a ninth basal plane dislocation 39, and a tenth basal plane dislocation 40, for example. Sixth basal plane dislocation 36 is on the outside of first threading dislocation 1. Seventh basal plane dislocation 37 is on the outside of sixth basal plane dislocation 36. Eighth basal plane dislocation 38 is on the outside of seventh basal plane dislocation 37. Ninth basal plane dislocation 39 is on the outside of eighth basal plane dislocation 38. Tenth basal plane dislocation 40 is on the outside of ninth basal plane dislocation 39.

A line segment 43 connecting first threading dislocation 1 and tenth basal plane dislocation 40 located at an outermost circumference when viewed from the direction perpendicular to main surface 14 is assumed. A contact point between line segment 43 and tenth basal plane dislocation 40 is assumed as a first position 44, and an intermediate position between first position 44 and first threading dislocation 1 is assumed as a second position 45. A distance 114 from first threading dislocation 1 to second position 45 is the same as a distance 113 from second position 45 to first position 44. In annular defect 5 shown in FIG. 5, three basal plane dislocations (sixth basal plane dislocation 36, seventh basal plane dislocation 37, and eighth basal plane dislocation 38) are present in a region from first threading dislocation 1 to second position 45, and two basal plane dislocations (ninth basal plane dislocation 39 and tenth basal plane dislocation 40) are present in a region from second position 45 to first position 44. A linear density of the basal plane dislocations in the region from first threading dislocation 1 to second position 45 may be higher than a linear density of the basal plane dislocations in the region from second position 45 to first position 44. From another viewpoint, the linear density of basal plane dislocations 3 on an inner circumferential side of annular defect 5 may be higher than the linear density of basal plane dislocations 3 on an outer circumferential side of annular defect 5.

As shown in FIG. 2, the area density of the plurality of threading dislocations 4 in main surface 14 is more than or equal to 50 cm$^{-2}$. Threading dislocations 4 include first threading dislocation 1 and second threading dislocation 2. Although a lower limit of the area density of the plurality of threading dislocations 4 in main surface 14 is not particularly limited, the area density may be more than or equal to 100 cm$^{-2}$, or more than or equal to 200 cm$^{-2}$, for example. Although an upper limit of the area density of the plurality of threading dislocations 4 in main surface 14 is not particularly limited, the area density may be less than or equal to 5000 cm$^{-2}$, or less than or equal to 1000 cm$^{-2}$, for example.

The value obtained by dividing the area density of annular defect 5 when viewed from the direction perpendicular to main surface 14 by the area density of the plurality of threading dislocations 4 in main surface 14 is more than or equal to 0.00002 and less than or equal to 0.004. Although a lower limit of the value is not particularly limited, the value may be more than or equal to 0.00004, or more than or equal to 0.00008, for example. Although an upper limit of the value is not particularly limited, the value may be less than or equal to 0.002, or less than or equal to 0.001, for example.

As shown in FIG. 2, annular defect 5 has a maximum diameter 112 of less than or equal to 0.2 mm, for example, when viewed from the direction perpendicular to main surface 14. Although an upper limit of maximum diameter 112 is not particularly limited, it may be less than or equal to 0.1 mm, or less than or equal to 0.05 mm, for example. Annular defect 5 has maximum diameter 112 of more than or equal to 0.03 mm, for example, when viewed from the direction perpendicular to main surface 14. Although a lower limit of maximum diameter 112 is not particularly limited, it may be more than or equal to 0.05 mm, or more than or equal to 0.08 mm, for example.

As described later, scratches (polish marks) are hardly formed in first main face 11 of silicon carbide substrate 10. Thus, main surface 14 of silicon carbide epitaxial film 20 formed on first main face 11 has a smaller surface roughness, when compared with a case where a large number of scratches are formed in first main face 11. Specifically, first main face 11 has an arithmetic average roughness (Sa) of less than or equal to 0.5 nm, for example. The arithmetic average roughness (Sa) is a parameter obtained by extending a two-dimensional arithmetic average roughness (Ra) to three dimensions. The arithmetic average roughness (Sa) can be measured with a white light interference microscope, for example. Specifically, after silicon carbide epitaxial film 20 is removed from silicon carbide substrate 10, first main face 11 of silicon carbide substrate 10 is observed with the white light interference microscope. As the white light interference microscope, BW-D507 manufactured by Nikon Corp. can be used, for example. A measurement range for measuring the arithmetic average roughness (Sa) is a square region of 255 μm by 255 μm, for example. The center of a diagonal line of the square region is assumed as the center of first main face 11, for example.

(Method for Measuring Area Density of Annular Defect)

Next, a method for measuring the area density of annular defect 5 will be described. To observe annular defect 5 having basal plane dislocations 3, a photoluminescence imaging device manufactured by PHOTON Design Corp. (model number: PUS-100) is used, for example. When excitation light is emitted onto a region to be measured in silicon carbide epitaxial substrate 100, photoluminescence light is observed from the region to be measured. As an excitation light source, a mercury xenon lamp is used, for example. The excitation light from the light source passes through a 313-nm band pass filter, and thereafter is emitted onto the region to be measured. The photoluminescence light passes through a 750-nm low pass filter, for example, and thereafter reaches a light receiving element such as a camera. In this manner, a photoluminescence image of the region to be measured is captured. Measurement is performed at room temperature.

While moving silicon carbide epitaxial substrate 100 in a direction parallel to main surface 14 of silicon carbide epitaxial film 20, for example, a photoluminescence image of main surface 14 is captured. Thereby, the photoluminescence image in the entire region of main surface 14 is mapped. In the obtained photoluminescence image, any annular basal plane dislocation is specified. A group of the plurality of basal plane dislocations 3 provided substantially concentrically constitute one annular defect 5. The area density of annular defect 5 is calculated by dividing the total number of annular defects 5 by the total measured area.

(Method for Measuring Area Density of Threading Dislocation)

Next, a method for measuring the area density of threading dislocation 4 will be described. Threading dislocation 4 can be confirmed by an etch pit method, for example. With the etch pit method, a pit originating from threading dislocation 4 can be distinguished for example as described below. For etching, a potassium hydroxide (KOH) melt is used, for example. The temperature of the KOH melt is set to more than or equal to about 500° C. and less than or equal to about 550° C. The etching time is set to more than or equal to about 5 minutes and less than or equal to about 10 minutes. After the etching, main surface 14 is observed with a Nomarski differential interference microscope. An etch pit originating from a threading screw dislocation has a hexagonal planar shape, for example, and the length of a diagonal line of a hexagon is typically more than or equal to about 30 μm and less than or equal to about 50 μm. An etch pit originating from a threading edge dislocation has a hexagonal planar shape, for example, and is smaller than the etch pit originating from a threading screw dislocation. In the etch pit originating from a threading edge dislocation, the length of a diagonal line of a hexagon is typically more than or equal to about 15 μm and less than or equal to about 20 μm.

As described above, each of the plurality of threading dislocations 4 penetrates each of silicon carbide epitaxial film 20 and silicon carbide substrate 10. Thus, it can be estimated that the area density of threading dislocations 4 in main surface 14 of silicon carbide epitaxial film 20 is the same as the area density of threading dislocations 4 in first main face 11 of silicon carbide substrate 10. In particular, in a case where main surface 14 is the (000-1) plane or the plane inclined relative to the (000-1) plane by off angle θ of less than or equal to 5°, an etch pit is less likely to appear in main surface 14 due to the KOH melt. In this case, the area density of threading dislocations 4 in first main face 11 of silicon carbide substrate 10 may be measured after removing silicon carbide epitaxial film 20 from silicon carbide substrate 10. It is estimated that the area density of threading dislocations 4 in first main face 11 is the same as the area density of threading dislocations 4 in main surface 14.

(Method for Manufacturing Silicon Carbide Epitaxial Substrate)

Next, a method for manufacturing silicon carbide epitaxial substrate 100 in accordance with the present embodiment will be described.

First, a silicon carbide single crystal substrate preparing step is performed. A silicon carbide single crystal having a polytype of 4H is manufactured by a sublimation method, for example. Then, silicon carbide substrate 10 is prepared by slicing the silicon carbide single crystal using a wire saw, for example (see FIG. 6). Silicon carbide substrate 10 contains an n type impurity such as nitrogen, for example. The conductivity type of silicon carbide substrate 10 is n type, for example.

Figure 6:
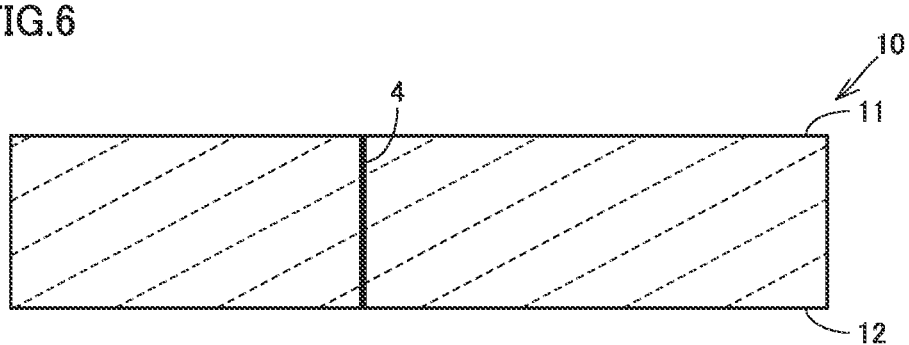
FIG. 6 is a schematic cross sectional view showing a first step of a method for manufacturing the silicon carbide epitaxial substrate in accordance with the present embodiment.

As shown in FIG. 6, silicon carbide substrate 10 has first main face 11, and second main face 12 opposite to first main face 11. First main face 11 is, for example, a plane inclined in the off direction by off angle θ relative to the (0001) plane. The off direction is the <11-20> direction, for example. First main face 11 of silicon carbide substrate 10 has a maximum diameter of more than or equal to 150 mm, for example. In silicon carbide substrate 10, for example, threading dislocation 4 is present. Threading dislocation 4 is exposed at both first main face 11 and second main face 12.

Figure 7:
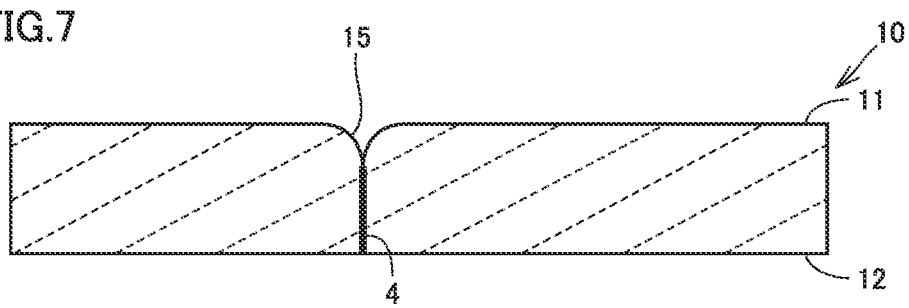
FIG. 7 is a schematic cross sectional view showing a second step of the method for manufacturing the silicon carbide epitaxial substrate in accordance with the present embodiment.

Subsequently, a mechanical polishing step is performed. In the mechanical polishing step, mechanical polishing is performed on first main face 11 of silicon carbide substrate 10. Specifically, silicon carbide substrate 10 is held at a polishing head such that first main face 11 faces a surface plate. A slurry containing abrasive grains is supplied between the surface plate and first main face 11. The abrasive grains are diamond abrasive grains, for example. The vicinity of threading dislocation 4 is mechanically weak, when compared with a portion therearound. Thus, after the mechanical polishing step, a recess 15 which is continuous to threading dislocation 4 is formed in first main face 11 (see FIG. 7).

Subsequently, a chemical mechanical polishing step is performed. In the chemical mechanical polishing step, chemical mechanical polishing is performed on first main face 11 of silicon carbide substrate 10. Specifically, silicon carbide substrate 10 is held at the polishing head such that first main face 11 faces the surface plate. A slurry containing abrasive grains is supplied between the surface plate and first main face 11. The abrasive grains are nanodiamond abrasive grains, for example. The nanodiamond abrasive grains have an average particle size of 3 nm to 4 nm, for example. The slurry contains hydrogen peroxide water (an oxidant), for example.

Figure 8:
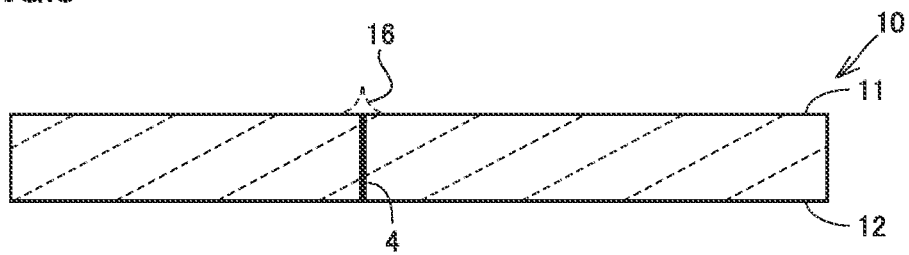
FIG. 8 is a schematic cross sectional view showing a third step of the method for manufacturing the silicon carbide epitaxial substrate in accordance with the present embodiment.

Generally, when chemical mechanical polishing is performed on silicon carbide substrate 10, a polishing solution which contains an oxidant and a slurry containing colloidal silica is used. When the polishing solution is used, the surface of silicon carbide substrate 10 is converted to an oxide utilizing a chemical reaction such as oxidation, and the oxide is removed by the colloidal silica having a hardness lower than that of silicon carbide. That is, first main face 11 of silicon carbide substrate 10 is polished mainly utilizing a chemical action of the oxidant. Due to the chemical action of the oxidant, a protrusion 16 (see FIG. 8) is formed in the portion of first main face 11 where threading dislocation 4 is exposed. When silicon carbide epitaxial film 20 grows on protrusion 16, annular defect 5 (see FIG. 3) originating from protrusion 16 is likely to be formed in silicon carbide epitaxial film 20.

In the method for manufacturing silicon carbide epitaxial substrate 100 in accordance with the present embodiment, first main face 11 of silicon carbide substrate 10 is polished mainly utilizing a physical action of the nanodiamond. That is, in the chemical mechanical polishing step of the present embodiment, hydrogen peroxide water having a low concentration is used. The hydrogen peroxide water has a concentration of 5%, for example. Accordingly, when the chemical mechanical polishing method of the present embodiment is used, first main face 11 is polished mainly by the physical action. Even in a case where protrusion 16 is formed in first main face 11 due to the chemical action of the hydrogen peroxide water, protrusion 16 is removed by the physical action of the nanodiamond. As a result, formation of protrusion 16 which is continuous to a threading dislocation in first main face 11 can be suppressed (see FIG. 8). Accordingly, annular defect 5 originating from protrusion 16 can be reduced.

It should be noted that, in order to further reduce annular defect 5, it is conceivable to perform mechanical polishing by utilizing the physical action of the nanodiamond only, without utilizing the chemical action of the hydrogen peroxide water. However, when mechanical polishing is performed by utilizing the physical action of the nanodiamond only, scratches (polish marks) are likely to be formed in first main face 11 of silicon carbide substrate 10. Therefore, it is desirable to use a polishing solution containing hydrogen peroxide water to some extent. Protrusion 16 may remain in first main face 11 to some extent.

Subsequently, silicon carbide epitaxial film 20 is formed on silicon carbide substrate 10. Specifically, the temperature of silicon carbide substrate 10 is increased to about 1630° C., for example. Then, silicon carbide substrate 10 is etched by hydrogen gas. Then, buffer layer 21 is formed on silicon carbide substrate 10 using a mixed gas containing silane ($SiH_4$), propane ($C_3H_8$), ammonia ($NH_3$), and hydrogen, for example. The flow rate of the silane gas is adjusted to be 46 sccm, for example. The flow rate of the propane gas is adjusted to be 29 sccm, for example. The flow rate of the ammonia gas is adjusted to be 1.5 sccm, for example. The flow rate of the hydrogen gas is adjusted to be 100 slm. Buffer layer 21 has a thickness of 1 μm, for example.

Then, drift layer 22 is formed on buffer layer 21 using a mixed gas containing silane, propane, ammonia, and hydrogen, for example. Specifically, the flow rate of the silane gas is adjusted to be 115 sccm, for example. The flow rate of the propane gas is adjusted to be 57.6 sccm, for example. The flow rate of the ammonia gas is adjusted to be $2.5 \times 10^{-2}$ sccm, for example. The flow rate of the hydrogen gas is adjusted to be 100 slm. Drift layer 22 has a thickness of 10 μm, for example. Buffer layer 21 and drift layer 22 constitute silicon carbide epitaxial film 20. Thereby, silicon carbide epitaxial substrate 100 having silicon carbide substrate 10 and silicon carbide epitaxial film 20 is manufactured (see FIG. 3).

(Method for Manufacturing Silicon Carbide Semiconductor Device)

Next, a method for manufacturing silicon carbide semiconductor device 300 in accordance with the present embodiment will be described.

The method for manufacturing the silicon carbide semiconductor device in accordance with the present embodiment mainly has an epitaxial substrate preparing step (S10: FIG. 9) and a substrate processing step (S20: FIG. 9).

First, the epitaxial substrate preparing step (S10: FIG. 9) is performed. Specifically, silicon carbide epitaxial substrate 100 is prepared by the method for manufacturing silicon carbide epitaxial substrate 100 described above (see FIG. 3).

Subsequently, the substrate processing step (S20: FIG. 9) is performed. Specifically, the silicon carbide semiconductor device is manufactured by processing silicon carbide epitaxial substrate 100. The "processing" includes various types of processing such as ion implantation, heat treatment, etching, oxide film formation, electrode formation, and dicing, for example. That is, the substrate processing step may include at least one of ion implantation, heat treatment, etching, oxide film formation, electrode formation, and dicing.

In the following, a method for manufacturing a MOSFET (Metal Oxide Semiconductor Field Effect Transistor) as an example of the silicon carbide semiconductor device will be described. The substrate processing step (S20: FIG. 9) includes an ion implantation step (S21: FIG. 9), an oxide film forming step (S22: FIG. 9), an electrode forming step (S23. FIG. 9), and a dicing step (S24: FIG. 9), for example.

First, the ion implantation step (S21: FIG. 9) is performed. A p type impurity such as aluminum (Al), for example, is implanted into main surface 14 on which a mask (not shown) having an opening is formed. Thereby, a body region 132 having a p type conductivity type is formed. Then, an n type impurity such as phosphorus (P), for example, is implanted into a predetermined position within body region 132. Thereby, a source region 133 having an n type conductivity type is formed. Then, a p type impurity such as aluminum is implanted into a predetermined position within source region 133, Thereby, a contact region 134 having the p type conductivity type is formed (see FIG. 10).

In second layer 22 of silicon carbide epitaxial film 20, a portion other than body region 132, source region 133, and contact region 134 serves as a drift region 131. Source region 133 is separated from drift region 131 by body region 132, Ion implantation may be performed with silicon carbide epitaxial substrate 100 being heated to more than or equal to about 300° C. and less than or equal to about 600° C. After the ion implantation, activation annealing is performed on silicon carbide epitaxial substrate 100. By the activation annealing, the impurities implanted into silicon carbide epitaxial film 20 are activated, and carriers are generated in each region. The atmosphere for the activation annealing is an argon (Ar) atmosphere, for example. The temperature for the activation annealing is about 1800° C., for example. The time for the activation annealing is about 30 minutes, for example.

Figure 11:
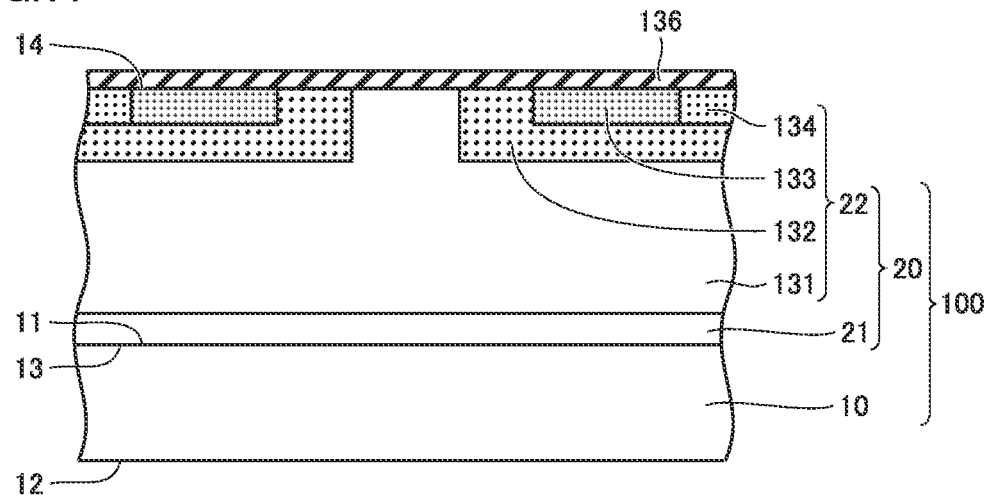
FIG. 11 is a schematic cross sectional view showing a second step of the method for manufacturing the silicon carbide semiconductor device in accordance with the present embodiment.

Subsequently, the oxide film forming step (S22: FIG. 9) is performed. An oxide film 136 is formed on main surface 14 (see FIG. 11) by heating silicon carbide epitaxial substrate 100 in an atmosphere containing oxygen, for example. Oxide film 136 is composed of silicon dioxide or the like, for example. Oxide film 136 functions as a gate insulating film. The temperature for thermal oxidation treatment is about 1300° C., for example. The time for the thermal oxidation treatment is about 30 minutes, for example.

After oxide film 136 is formed, heat treatment may be further performed in a nitrogen atmosphere. For example, the heat treatment is performed in an atmosphere of nitric oxide, at about 1100° C. for about one hour. Thereafter, heat treatment is further performed in an argon atmosphere. For example, the heat treatment is performed in the argon atmosphere, at more than or equal to about 1100° C. and less than or equal to about 1500° C., for about one hour.

Subsequently, the electrode forming step (S23: FIG. 9) is performed. Specifically, a gate electrode 141 is formed on oxide film 136. Gate electrode 141 is formed by a CVD (Chemical Vapor Deposition) method, for example. Gate electrode 141 is composed of polysilicon or the like having electrical conductivity, for example. Gate electrode 141 is formed at a position facing source region 133 and body region 132.

Then, an interlayer insulating film 137 covering gate electrode 141 is formed. Interlayer insulating film 137 is formed by the CVD method, for example. Interlayer insulating film 137 is composed of silicon dioxide or the like, for example. Interlayer insulating film 137 is formed to conic into contact with gate electrode 141 and oxide film 136. Then, portions of oxide film 136 and interlayer insulating film 137 are removed by etching. Thereby, source region 133 and contact region 134 are exposed from oxide film 136.

Then, a source electrode 142 is formed at the exposed portion by a sputtering method, for example. Source electrode 142 is composed of titanium, aluminum, silicon, or the like, for example. After source electrode 142 is formed, source electrode 142 and silicon carbide epitaxial substrate 100 are heated at a temperature of more than or equal to about 900° C. and less than or equal to about 1100° C., for example. Thereby, source electrode 142 and silicon carbide epitaxial substrate 100 come into ohmic contact with each other. Then, an interconnection layer 138 is formed to come into contact with source electrode 142. Interconnection layer 138 is composed of a material containing aluminum, for example. Then, a drain electrode 143 is formed on third main face 13. Drain electrode 143 is composed of an alloy containing nickel and silicon (for example, NiSi or the like), for example.

Figure 12:
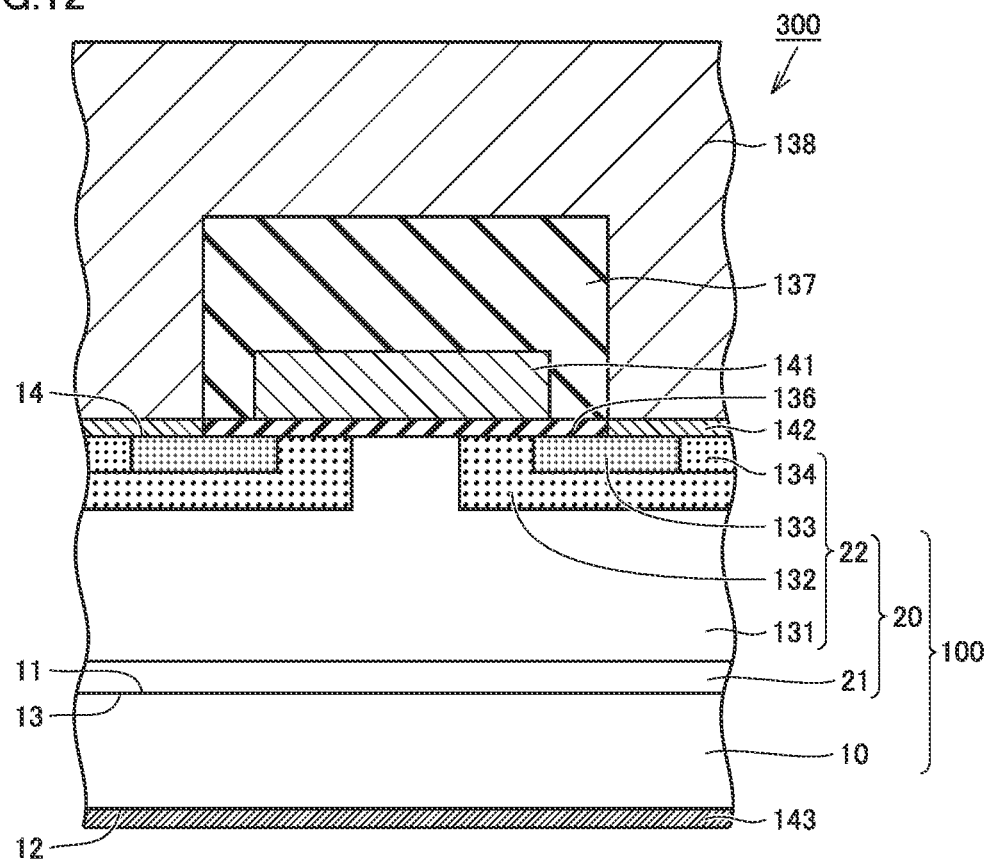
FIG. 12 is a schematic cross sectional view showing a configuration of the silicon carbide semiconductor device in accordance with the present embodiment.

Subsequently, the dicing step (S24: FIG. 9) is performed. Silicon carbide epitaxial substrate 100 is divided into a plurality of semiconductor chips by being diced along dicing lines. Thus, silicon carbide semiconductor device 300 is manufactured (see FIG. 12).

Although the method for manufacturing the silicon carbide semiconductor device in accordance with the present disclosure has been described above by taking a MOSFET as an example, the manufacturing method in accordance with the present disclosure is not limited thereto. The manufacturing method in accordance with the present disclosure is applicable to silicon carbide semiconductor devices such as an IGBT (Insulated Gate Bipolar Transistor), an SBD (Schottky Barrier Diode), a thyristor, a GTO (Gate Turn Off thyristor), a PiN diode, and the like, for example.

Next, the function and effect of silicon carbide epitaxial substrate 100 and the method for manufacturing the silicon carbide semiconductor device in accordance with the present embodiment will be described.

Generally, threading dislocation 4 is present in silicon carbide substrate 10. When chemical mechanical polishing is performed on silicon carbide substrate 10 having threading dislocation 4, protrusion 16 (see FIG. 8) may be formed in the surface of the silicon carbide substrate where threading dislocation 4 is exposed, due to the chemical action of the oxidant contained in the slurry. When silicon carbide epitaxial film 20 grows on protrusion 16, annular defect 5 (see FIG. 3) originating from protrusion 16 is likely to be formed in silicon carbide epitaxial film 20. Annular defect 5 reduces the reliability of the silicon carbide semiconductor device.

In silicon carbide epitaxial substrate 100 in accordance with the present embodiment, the value obtained by dividing the area density of annular defect 5 when viewed from the direction perpendicular to main surface 14 by the area density of the plurality of threading dislocations 4 in main surface 14 is less than or equal to 0.004. Thereby, the ratio of annular defect 5 can be reduced in silicon carbide epitaxial substrate 100 having a somewhat large number of threading dislocations 4. Therefore, the reliability of silicon carbide semiconductor device 300 can be improved.

Further, in silicon carbide epitaxial substrate 100 in accordance with the present embodiment, the value obtained by dividing the area density of annular defect 5 when viewed from the direction perpendicular to main surface 14 by the area density of the plurality of threading dislocations 4 in main surface 14 is more than or equal to 0.00002. As described above, in order to further reduce annular defect 5, it is conceivable to perform chemical mechanical polishing with the ratio of the physical action of the nanodiamond being further increased. However, when the ratio of the physical action is increased, scratches are likely to be formed in silicon carbide substrate 10. By setting the above value to more than or equal to 0.00002, there is no need to further increase the physical action of the nanodiamond, and thus formation of scratches in silicon carbide substrate 10 can be suppressed.

It should be understood that the embodiment disclosed herein is illustrative and non-restrictive in every respect. The scope of the present invention is defined by the scope of the claims, rather than the embodiment described above, and is intended to include any modifications within the scope and meaning equivalent to the scope of the claims.

REFERENCE SIGNS LIST

1: first threading dislocation; 2: second threading dislocation; 3: basal plane dislocation; 4: threading dislocation; 5: annular defect; 10: silicon carbide substrate; 11: first main face; 12: second main face; 13: third main face; 14: main surface; 15: recess; 16: protrusion; 17: first flat; 20: silicon carbide epitaxial film; 21: buffer layer (first layer); 22: drift layer (second layer); 31: first basal plane dislocation; 32: second basal plane dislocation; 33: third basal plane dislocation; 34: fourth basal plane dislocation; 35: fifth basal plane dislocation; 36: sixth basal plane dislocation; 37: seventh basal plane dislocation; 38: eighth basal plane dislocation; 39: ninth basal plane dislocation; 40: tenth basal plane dislocation; 41: first line segment; 42: second line segment; 43: line segment; 44: first position; 45: second position; 100: silicon carbide epitaxial substrate; 101: first direction; 102: second direction; 103: third direction; 104: fourth direction; 105: fifth direction; 111: maximum diameter; 113, 114: distance; 131: drift region; 132: body region; 133: source region; 134: contact region; 136: oxide film; 137: interlayer insulating film; 138: interconnection layer; 141: gate electrode; 142: source electrode; 143: drain electrode; 300: silicon carbide semiconductor device.

The invention claimed is:

1. A silicon carbide epitaxial substrate comprising:
a silicon carbide substrate; and
a silicon carbide epitaxial film on the silicon carbide substrate,
the silicon carbide substrate and the silicon carbide epitaxial film having a polytype of 4H,
a main surface of the silicon carbide epitaxial film being a {0001} plane or a plane inclined relative to the {0001} plane by an off angle of less than or equal to 5°,
the main surface having a maximum diameter of more than or equal to 150 mm,
the silicon carbide epitaxial film having a plurality of arc-shaped or annular basal plane dislocations and a plurality of threading dislocations,
the plurality of threading dislocations having a first threading dislocation which is surrounded by the plurality of basal plane dislocations and a second threading dislocation which is not surrounded by the plurality of basal plane dislocations, when viewed from a direction perpendicular to the main surface,
the plurality of basal plane dislocations and the first threading dislocation constituting an annular defect,
an area density of the plurality of threading dislocations in the main surface being more than or equal to 50 cm$^{-2}$,
a value obtained by dividing an area density of the annular defect when viewed from the direction perpendicular to the main surface by the area density of the plurality of threading dislocations in the main surface being more than or equal to 0.00002 and less than or equal to 0.004.

2. The silicon carbide epitaxial substrate according to claim 1, wherein the main surface is a (0001) plane or a plane inclined relative to the (0001) plane by an off angle of less than or equal to 5°.

3. The silicon carbide epitaxial substrate according to claim 1, wherein the annular defect has a maximum diameter of less than or equal to 0.2 mm when viewed from the direction perpendicular to the main surface.

4. The silicon carbide epitaxial substrate according to claim 1, wherein the annular defect has a maximum diameter of more than or equal to 0.03 mm when viewed from the direction perpendicular to the main surface.

5. A silicon carbide epitaxial substrate comprising:
a silicon carbide substrate; and
a silicon carbide epitaxial film on the silicon carbide substrate,
the silicon carbide substrate and the silicon carbide epitaxial film having a polytype of 4H,
a main surface of the silicon carbide epitaxial film being a (0001) plane or a plane inclined relative to the (0001) plane by an off angle of less than or equal to 5°,
the main surface having a maximum diameter of more than or equal to 150 mm, the silicon carbide epitaxial film having a plurality of arc-shaped or annular basal plane dislocations and a plurality of threading dislocations, the plurality of threading dislocations having a first threading dislocation which is surrounded by the plurality of basal plane dislocations and a second threading dislocation which is not surrounded by the plurality of basal plane dislocations, when viewed from a direction perpendicular to the main surface, the plurality of basal plane dislocations and the first threading dislocation constituting an annular defect, the annular defect having a maximum diameter of more than or equal to 0.03 mm and less than or equal to 0.2 mm when viewed from the direction perpendicular to the main surface, an area density of the plurality of threading dislocations in the main surface being more than or equal to 50 $cm^{-2}$, a value obtained by dividing an area density of the annular defect when viewed from the direction perpendicular to the main surface by the area density of the plurality of threading dislocations in the main surface being more than or equal to 0.00002 and less than or equal to 0.004.

6. A method for manufacturing a silicon carbide semiconductor device, comprising:

preparing a silicon carbide epitaxial substrate according to claim 1; and processing the silicon carbide epitaxial substrate.

7. The silicon carbide epitaxial substrate according to claim 2, wherein the annular defect has a maximum diameter of less than or equal to 0.2 mm when viewed from the direction perpendicular to the main surface.

8. The silicon carbide epitaxial substrate according to claim 2, wherein the annular defect has a maximum diameter of more than or equal to 0.03 mm when viewed from the direction perpendicular to the main surface.

9. The silicon carbide epitaxial substrate according to claim 3, wherein the annular defect has a maximum diameter of more than or equal to 0.03 mm when viewed from the direction perpendicular to the main surface.

10. The silicon carbide epitaxial substrate according to claim 7, wherein the annular defect has a maximum diameter of more than or equal to 0.03 mm when viewed from the direction perpendicular to the main surface.

11. A method for manufacturing a silicon carbide semiconductor device, comprising:

preparing a silicon carbide epitaxial substrate according to claim 2; and processing the silicon carbide epitaxial substrate.

12. A method for manufacturing a silicon carbide semiconductor device, comprising:

preparing a silicon carbide epitaxial substrate according to claim 3; and processing the silicon carbide epitaxial substrate.

13. A method for manufacturing a silicon carbide semiconductor device, comprising:

preparing a silicon carbide epitaxial substrate according to claim 4; and processing the silicon carbide epitaxial substrate.

14. A method for manufacturing a silicon carbide semiconductor device, comprising:

preparing a silicon carbide epitaxial substrate according to claim 7; and processing the silicon carbide epitaxial substrate.

15. A method for manufacturing a silicon carbide semiconductor device, comprising:

preparing a silicon carbide epitaxial substrate according to claim 8; and processing the silicon carbide epitaxial substrate.

16. A method for manufacturing a silicon carbide semiconductor device, comprising:

preparing a silicon carbide epitaxial substrate according to claim 9; and processing the silicon carbide epitaxial substrate.

17. A method for manufacturing a silicon carbide semiconductor device, comprising:

preparing a silicon carbide epitaxial substrate according to claim 10; and processing the silicon carbide epitaxial substrate.

18. A method for manufacturing a silicon carbide semiconductor device, comprising:

preparing a silicon carbide epitaxial substrate according to claim 5; and processing the silicon carbide epitaxial substrate.

* * * * *